United States Patent [19]

Patrin

[11] 3,996,600
[45] Dec. 7, 1976

[54] CHARGE COUPLED OPTICAL SCANNER WITH BLOOMING CONTROL

[75] Inventor: Nicholas Alex Patrin, Shelburne, Vt.

[73] Assignee: International Business Machines Corporation, Armonk, N.Y.

[22] Filed: July 10, 1975

[21] Appl. No.: 594,892

[52] U.S. Cl. .................................. 357/30; 357/24; 307/311; 178/7.1
[51] Int. Cl.² ................ H01L 27/14; H01L 31/00; H01L 29/78
[58] Field of Search .................. 357/24, 30, 32

[56] References Cited
UNITED STATES PATENTS

| | | | |
|---|---|---|---|
| 3,863,065 | 1/1975 | Kosonocky et al. | 357/24 |
| 3,896,485 | 7/1975 | Early | 357/24 |
| 3,931,465 | 1/1976 | Levine | 357/24 |

Primary Examiner—William D. Larkins
Assistant Examiner—Gene M. Munson
Attorney, Agent, or Firm—Edward S. Gershuny

[57] ABSTRACT

An improved optical scanner including a semiconductor charge coupled shift register. The device is formed in a semiconductor substrate of a selected conductivity type ($p$ or $n$). The substrate contains pockets of the opposite conductivity type ($n$ or $p$), the pockets alternating between plus and minus. When the substrate and the pockets are biased to opposite electrical potentials, excess minority charges (caused by concentrated high intensity light) will be directed into the substrate to prevent "blooming".

3 Claims, 4 Drawing Figures

CHARGE COUPLED OPTICAL SCANNER WITH BLOOMING CONTROL

BACKGROUND OF THE INVENTION

This invention relates to an improved optical scanner which includes semiconductor charge coupled shift registers. More particularly, it relates to a charge coupled device that is so structured as to eliminate blooming.

Charge coupled devices store and transfer information in the form of electrical charge. They generally comprise metal electrodes on top of an insulating layer on top of a semiconductor substrate. In typical prior art devices, the semiconductor portion is, for the most part, homogeneously doped, regions of different conductivity being required only for injecting or extracting charge. (See, for example, Boyle et al, Bell System Technical Journal, 48,587 (1970).) In the shift register, a DC bias sufficient to deplete the semiconductor surface is applied between electrodes, and the semiconductor material and clocking pulses are applied sequentially to the electrodes. Because of the applied bias and clocking signals, semiconductor surface minority carrier are drawn to the semiconductor-insulator interface and tend to collect in the potential wells under the metal electrode. When the clocking pulses are sufficiently large, the minority carriers migrate from the area under one electrode to the area under the next following a potential well produced by the clocking pulses.

One major problem associated with the utilization of charge coupled device shift registers in optical scanning systems is the finite quantity of charge that can be stored in a potential well. When too much charge is generated within a potential well (for example, by localized intense light) the excess charge tends to spill over into adjacent potential wells. This phenomenon, known as "blooming", can cause a charge coupled optical scanner to react to a localized intense beam of light in the same manner that it would be expected to react to a more diffuse source of light, resulting in incorrect readings.

One prior art approach to the "blooming" problem utilizes an additional electrode that is adjacent to the electrodes which form the charge coupled shift register. The additional electrode is utilized as a reservoir to receive overflow electrical charge from the electrodes of the shift register. The reservoir action of the additional electrode is dependent upon having a portion of it overlay a reverse-biased semiconductor region to provide a sink for overflow charges which flow from the shift register electrodes. Among the disadvantages of this prior art approach are: the fact that an additional electrode is needed; its density disadvantage (because the silicon area required for such a structure is approximately doubled in size due to the lateral overflow reservoir); and its requirement of an additional level of metallization in, e.g., two dimensional arrays.

It is a general object of this invention to provide an improved charged coupled optical scanner.

A more particular object is the provision of a semiconductor charge optical scanner wherein "blooming" due to localized areas of intense light is prevented.

Another object is to accomplish the above without using additional electrodes.

BRIEF DESCRIPTION OF THE DRAWINGS

In accordance with one aspect of a preferred embodiment of the invention, an optical scanner includes a substrate of a first semiconductor type ($p$ or $n$). Within the substrate are pockets of the alternate semiconductor type ($n$ or $p$), with the pocket doping levels alternating between two different values. When the substrate and the pockets are biasaed with appropriate opposite electrical potentials, an excess of minority charges in a potential well (due, for example, to localized areas of intense light) will be directed back to the substrate rather than to adjacent potential wells.

The most significant advantage of this invention is its elimination of the "blooming" problem. This advantage is attained without any use of additional electrodes.

The above and other objects, features and advantages of the invention will be apparent from the following more particular description of a preferred embodiment thereof as illustrated in the accompanying drawings.

DESCRIPTION OF THE DRAWINGS

Figure 1:
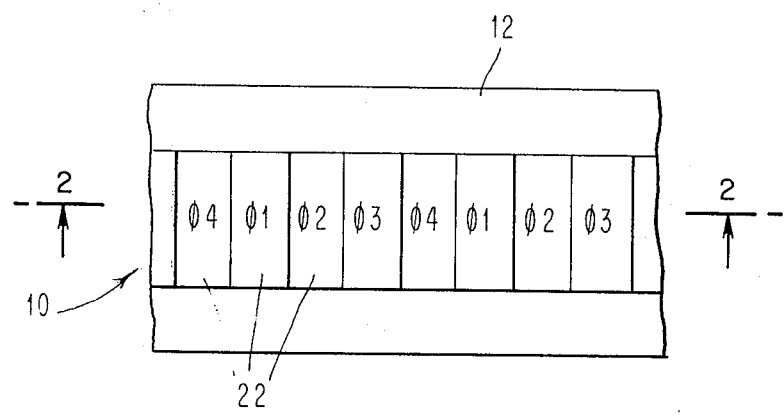
Figure 2:
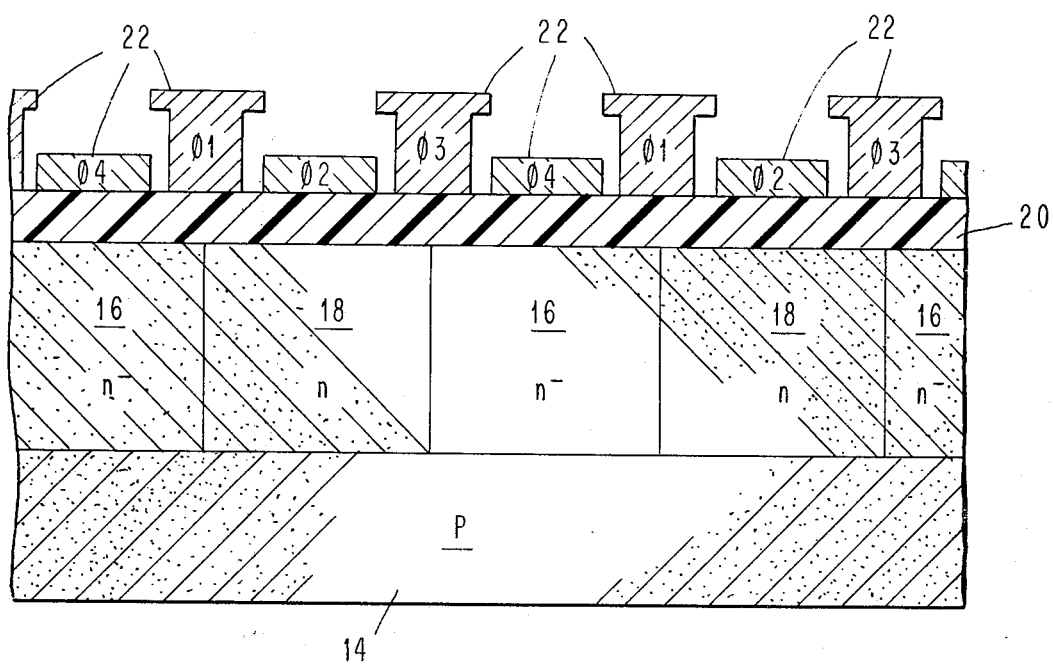
Figure 3:
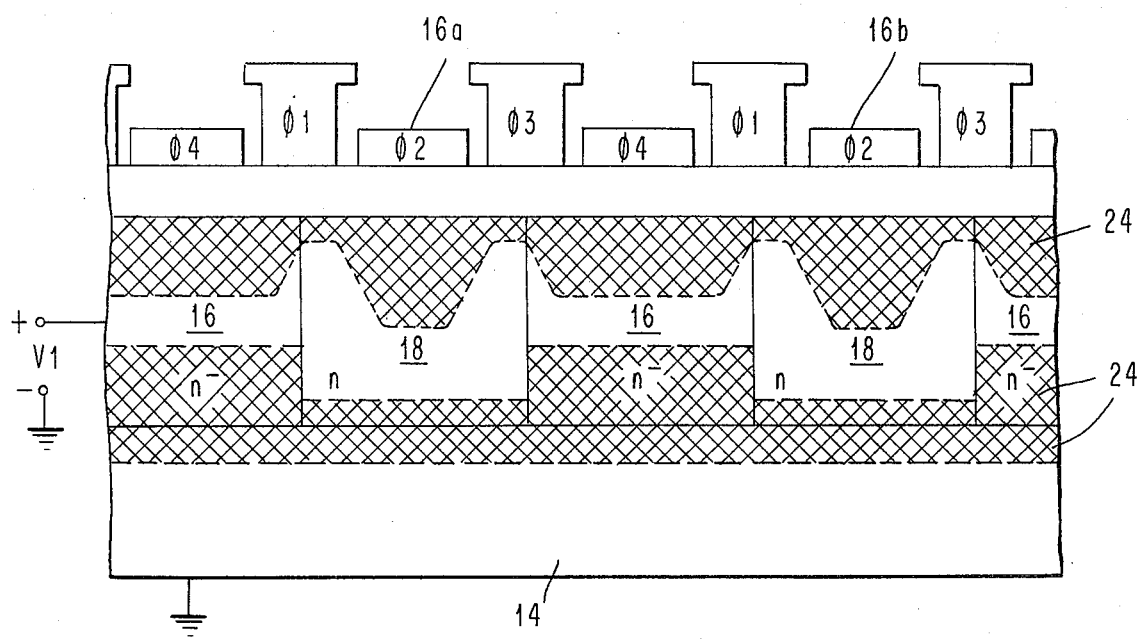
Figure 4:
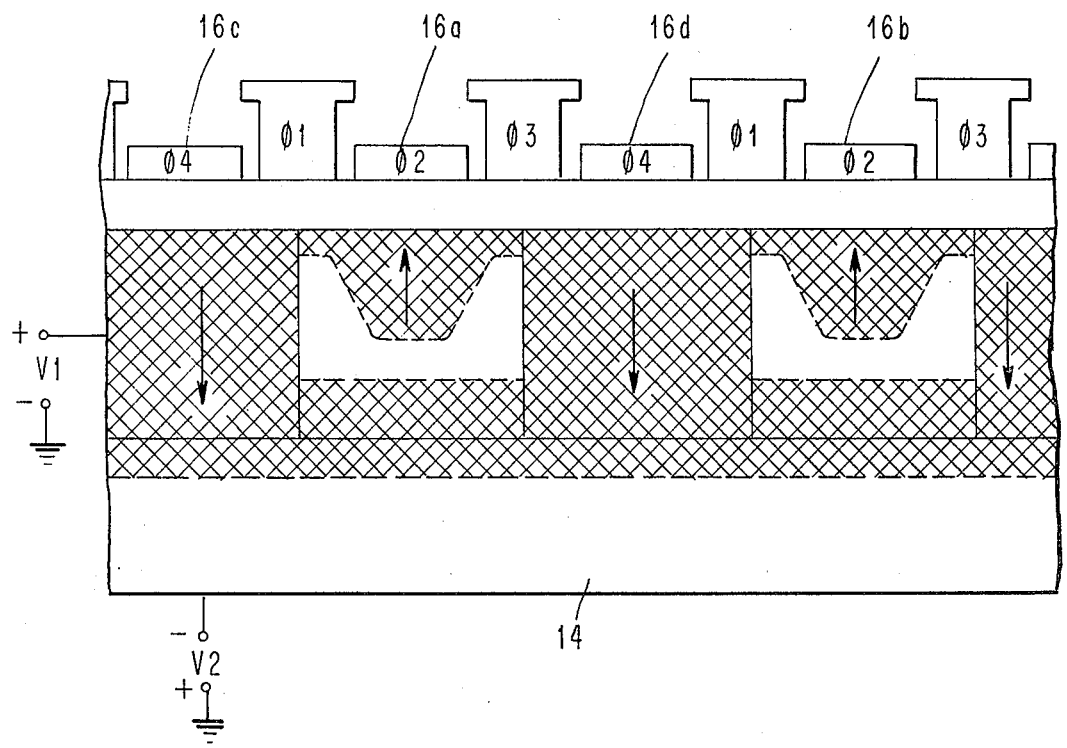

FIG. 1 is a plan view illustrating a portion of a semiconductor charge coupled shift register;

FIG. 2 is a cross section of FIG. 1 along line 2—2 illustrating the constituent parts of the device;

FIG. 3 is similar to FIG. 2 but also illustrates the space charge or depletion region distribution when the pockets are biased by a positive potential and the substrate is grounded; and FIG. 4 is similar to FIG. 3 illustrating the space charge distribution when the pockets are biased by a positive potential and the substrate is biased by a negative potential.

DETAILED DESCRIPTION

The structure of a portion of a charge coupled optical scanner system is illustrated in FIGS. 1 and 2. The scanner includes a charge coupled shift register 10 defined on a semiconductor surface 12. As is more particularly shown in FIG. 2, the semiconductor material includes a substrate 14 that is preferably p-type silicon having a resistivity of, for example, 2 ohm-centimeters. Within the substrate 14 of p-type silicon are pockets of n-type silicon. These n-regions could be established, for example, by employing arsenic or phosphorous ion implantation techniques. The pockets of n-type silicon alternate between $n^-$ silicon 16 and n-type silicon 18. The $n^-$ type and the n-type silicon have different doping concentrations and the values of these concentrations depend on several design considerations. In a nominal design, the $n^-$ resistivity may be, e.g., 50 ohm-cm while the n resistivity may be, e.g., 2 ohm-cm. A thin insulating layer 20 is formed over the surface of the semiconductor material. The insulating layer may comprise silicon oxide or other suitable material (such as, for example, a combination of silicon nitride and silicon oxide) formed to a thickness on the order of approximately 1,000A. The electrodes of the charge coupled shift register are illustrated generally at 22. The electrodes may be comprised of any suitable conductive material, such as, for example, aluminum or polysilicon. The figures illustrate a double level metallization four-phase system, wherein shift register action is obtained by sequentially applying a multi-phased clock to successive electrodes. The $\phi 2$, $\phi 4$ electrodes may be polysilicon, which is semitransparent, while the $\phi1$, $\phi3$ electrodes could be aluminum. The use of semitransparent electrodes allows for imaging on the top surface of the structure. If completely opaque, overlapping, electrodes are used, the optical image is required to be projected on the back side of the wafer and the total wafer thickness has to be kept small in this case. Clock sources well known to those skilled in the art may be utilized, and they need not be described herein. The four-phase clock are illustrated in the figures at $\phi1$, $\phi2$, $\phi3$ and $\phi4$, respectively.

In the system illustrated herein, each set of four electrodes of the shift register comprise one bit of information, that is, one resolution unit of the scanner. Also, in the illustrated example, the $\phi2$ electrodes will be utilized during the light integration interval. The manner in which this is accomplished is described below.

If this system were controlled in a manner that is typical of the prior art, during the time in which light is being integrated, phase 2 of the clock would be biased to create the deepest potential well so that electrical charge under adjacent electrodes would flow to the potential well underlying $\phi2$. During a time interval in which $\phi1$, $\phi3$ and $\phi4$ were at ground while the $\phi2$ electrodes were energized to a potential $-V$, the substrate 14 were to be grounded and the pockets 16, 18, etc. were to be at some positive potential V1. depletion pockets would be formed under the $\phi2$ electrodes, and the depletion regions in the structure would be as shown by the regions generally identified as 24 in FIG. 3. In this situation, if an area of intense light were to be localized, for example, at electrode 16a it could cause a build up of charge that exceeds the storage capacity of the potential well which underlies the $\phi2$ electrode 16a. The excess charge would be likely to spill over into the potential well underlying $\phi2$ electrode 16b causing an undesirable "blooming" effect.

Referring now to FIG. 4, one can readily see the manner in which this system is controlled. All conditions are the same as those described above with respect to FIG. 3 except that the substrate 14 is reverse-biased by a negative electrical potential V2. In this preferred embodiment, V1 is, for example, 3 volts and V2 is, for example, a negative potential of 20 volts. In this situation, the depletion region on the $n^-$ side of each $p$-$n^-$ junction is forced to merge with the surface depletion region to an extent where punchthrough, or near-punchthrough is achieved between the junction and the surface, and the depletion profile will be as shown by the cross-hatched areas in FIG. 4. The forces exerted by the depletion region field on minority charges in the $n$ and $n^-$ regions will be in the direction shown by the arrows in FIG. 4. Thus, a high build up of charge in the potential well under $\phi2$ electrode 16a due to a localized area of intense light will tend to overflow down through the areas underlying $\phi4$ electrodes 16c and 16d to substrate 14, instead of to the potential well underlying the next $\phi2$ electrode 16b. This will eliminate the "blooming" that could have occurred if the system were controlled in the manner illustrated in FIG. 3. After illumination is removed, V2 will be collapsed to ground and information can be shifted out of the shift register utilizing well known charge coupled device phasing.

In this structure, the integrating cell electrodes are over the heavier doped regions ($n$) and are surrounded by cells with lighter doped ($n^-$) pockets.

In building this structure, one could start with a p-substrate, grow an n epi layer, and then use ion-implanation or diffusion procedures to establish $n^-$ pockets. Alternatively, if an $n^-$ epi surface is desired, ion-implantation or diffusion procedures could be used to define n pockets in an otherwise $n^-$ layer. For an area scanner the $n^-$ (or $n$) pockets wuld be replaced by $n^-$ (or $n$) strips.

Another technique would be to start with a p-substrate and use ion-implantation or diffusion procedures to establish a chain of $n$, $n^-$ pockets (or strips) in an otherwise $p$ surface.

A preferred technique is to start with a p-substrate and use ion-implantation or diffusion procedures to develop and $n$ (or $n^-$) skin at the surface, then use ion-implantation or diffusion procedures to generate $n^-$ (or $n$) pockets or strips.

Although the structure described above comprises alternate $n^-$ and $n$ pockets in a p-type substrate, those skilled in the art will recognize that an equivalent structure could utilize alternate $p^-$ and $p$ pockets in an n-type substrate.

Also, although the structure described herein is a four-phase system, the invention is also applicable to two-phase and three-phase structures.

By proper choice of V2, a biased charge may be held by the $\phi4$ nodes at all times. This technique would be more efficient than one in which the $\phi4$ nodes are only biased into accumulation during integration because, with this technique, surface states would not have to be refilled.

While the invention has been shown and described with reference to a preferred embodiment thereof, those skilled in the art will recognize that the above and other changes may be made therein without departing from the spirit and scope of the invention.

What is claimed is:

1. A charge coupled optical scanner comprising:
a semiconductor body of a first conductivity type ($p$ or $n$);
said body having therein alternating first and second surface regions, both of said surface regions being of the opposite conductivity type ($n$ or $p$);
means for biasing said surface regions so that said first surface regions store charges generated therein, and said second surface regions become substantially fully depleted;
electrodes overlying said first and second surface regions; and
means for biasing said electrodes so that charges generated within said first surface regions which exceed the storage capacity of said first surface regions will be extracted therefrom and shunted through said second surface regions to said semiconductor body.

2. A charge coupled optical scanner as in claim 1 further including:
means for biasing said semiconductor body to an electrical potential that is opposite, with respect to algebraic sign, to the bias of said surface regions.

3. A charge coupled optical scanner as in claim 2 wherein
said first surface regions are more heavily doped with impurity of said opposite conductivity type than said second surface regions.

* * * * *